United States Patent
Huang et al.

(10) Patent No.: US 12,060,652 B2
(45) Date of Patent: Aug. 13, 2024

(54) LINEAR SHOWERHEAD FOR GROWING GaN

(71) Applicant: SINO NITRIDE SEMICONDUCTOR CO., LTD., Guangdong (CN)

(72) Inventors: Ye Huang, Guangdong (CN); Peng Liu, Guangdong (CN); Jianhui Wang, Guangdong (CN); Jingquan Lu, Guangdong (CN)

(73) Assignee: SINO NITRIDE SEMICONDUCTOR CO., LTD. (CN)

( * ) Notice: Subject to any disclaimer, the term of this patent is extended or adjusted under 35 U.S.C. 154(b) by 70 days.

(21) Appl. No.: 17/310,565

(22) PCT Filed: Nov. 27, 2019

(86) PCT No.: PCT/CN2019/121191
§ 371 (c)(1),
(2) Date: Aug. 11, 2021

(87) PCT Pub. No.: WO2021/102726
PCT Pub. Date: Jun. 3, 2021

(65) Prior Publication Data
US 2022/0282396 A1    Sep. 8, 2022

(51) Int. Cl.
*C30B 29/40* (2006.01)
*C30B 25/14* (2006.01)

(52) U.S. Cl.
CPC .............. *C30B 29/40* (2013.01); *C30B 25/14* (2013.01)

(58) Field of Classification Search
CPC ........ C23C 16/45565; C23C 16/45574; C30B 25/14
See application file for complete search history.

(56) References Cited

U.S. PATENT DOCUMENTS

| 2005/0142391 A1 | 6/2005 | Dmitriev et al. |
| 2006/0021574 A1 | 2/2006 | Armour et al. |

(Continued)

FOREIGN PATENT DOCUMENTS

| CN | 1387233 | 12/2002 |
| CN | 101921996 | 12/2010 |

(Continued)

OTHER PUBLICATIONS

International Search Report and Written Opinion received for PCT/CN2019/121191, mailed Apr. 23, 2020.

(Continued)

*Primary Examiner* — Matthew J Song
(74) *Attorney, Agent, or Firm* — McDonald Hopkins LLC

(57) ABSTRACT

A linear showerhead for growing GaN, including a first gas base, a second gas base, and a third gas base. First central gas passages are disposed in the middle of the first gas base. A first gap is disposed between two adjacent first central gas passages. A first nozzle is disposed at the bottom of a first central gas passage. The second gas base is disposed on the first gas base. Second central gas passages are disposed in the middle of the second gas base. A second gap is disposed between two adjacent second central gas passages. Two sides of a second central gas passage are provided with a second nozzle. The third gas base includes third central gas passages. A third central gas passage penetrates a first gap and a second gap. A third nozzle is disposed at the bottom of a third central gas passage.

12 Claims, 9 Drawing Sheets

(56) References Cited

U.S. PATENT DOCUMENTS

| | | | |
|---|---|---|---|
| 2007/0134419 A1* | 6/2007 | Mitrovic | C23C 16/45574 |
| | | | 118/730 |
| 2009/0178615 A1 | 7/2009 | Kim et al. | |
| 2011/0143463 A1 | 6/2011 | Harada et al. | |
| 2014/0014745 A1* | 1/2014 | Burrows | C30B 25/14 |
| | | | 239/548 |
| 2014/0209015 A1 | 7/2014 | Yamada et al. | |
| 2014/0370691 A1 | 12/2014 | Yamada et al. | |
| 2018/0374721 A1* | 12/2018 | Suzuki | H01L 21/6719 |
| 2021/0180208 A1* | 6/2021 | Daigo | H01L 21/02529 |

FOREIGN PATENT DOCUMENTS

| | | |
|---|---|---|
| CN | 102971449 A | 3/2013 |
| CN | 109306458 | 2/2019 |
| DE | 102014201554 A1 | 7/2014 |
| JP | 2009167520 | 7/2009 |
| JP | 2011124517 | 6/2011 |
| KR | 20120080975 A | 7/2012 |

OTHER PUBLICATIONS

Japan Patent Office (JPO), Notification of Reasons for Rejection for Patent Application No. 2021-551867, drafted Aug. 31, 2022, Fourth Patent Examination Department, Japan.

Extended European Search Report for Application 19953754.9, PCT/CN2019/121191, dated Jul. 17, 2023, 9 pgs., European Patent Office, Germany.

* cited by examiner

LINEAR SHOWERHEAD FOR GROWING GaN

CROSS-REFERENCE TO RELATED APPLICATIONS

This is a National Stage Application filed under 37 U.S.C. 371 based on International Patent Application No. PCT/CN2019/121191, filed Nov. 27, 2019, the disclosures of which is incorporated herein by reference in its entirety.

TECHNICAL FIELD

The present application relates to the technical field of apparatuses for growing GaN and, in particular, to a composite showerhead for isolating and ejecting multiple gases, for example, a linear showerhead for growing GaN.

BACKGROUND

As the most important third-generation wide bandgap semiconductor material, gallium nitride (GaN) is widely applied to the preparation of blue LEDs and high-temperature, high-frequency, and high-power electronic elements. The technology of hydride vapor phase epitaxy (HVPE) is one of the methods for growing gallium nitride thick-film materials. With the features of high growth rate (up to 800 μm/h), low production cost, and simple growth process, the HVPE technology is right for the promotion and application of the gallium nitride (GaN) thick-film growth technology. In promoting the industrialization of GaN thick films and massively producing high-quality GaN thick films, the key rests in that a stable laminar flow field needs to be obtained in a reaction chamber. Moreover, a concentration field of groups III-V gases that are mixed homogeneously is obtained on the effective deposition area of a graphite susceptor in which one or more substrates of 2 to 8 inches made of sapphire, SiC, AlN, GaN, and the like can be placed. Further, the deposition caused by a pre-reaction at a nozzle needs to be avoided. The reason lies in that any pre-reaction at a nozzle of a showerhead generates plenty of GaN polycrystals at the nozzle rapidly. As the thermal expansion coefficient of the material for forming the showerhead differs from the thermal expansion coefficient of GaN polycrystals, the nozzle is shattered and damaged inevitably, thus making the entire apparatus fail to continue production. The preceding three points are critical factors determining the market competitiveness of GaN thick films directly and need to be emphasized.

Companies or teams producing GaN single crystals generally have uniquely designed showerheads. However, such showerheads are merely applicable to small models that produce single pieces of 2-inch GaN single crystals or three pieces of 2-inch GaN single crystals at a laboratory level. With low production capacity and high cost, the showerheads are not suitable for mass production and promotion. Alternatively, such showerheads can be applied to large models for producing multiple pieces, but cannot satisfy the quality requirement of users due to poor crystal quality caused by serious pre-reactions, poor homogeneity of crystal orientation, and multiple dropped particles. The preceding are the obstacles restricting the industrialization of GaN single crystals.

SUMMARY

The present application provides a linear showerhead for growing GaN. In a technical process, the linear showerhead can isolate reaction gases effectively and thus prevent reaction gases from being mixed in advance and causing a pre-reaction at a nozzle.

The present application adopts the solutions below.

The linear showerhead for growing GaN includes a first gas base, a second gas base, and a third gas base. A plurality of first central gas passages are disposed in the middle of the first gas base. A first gap is disposed between two adjacent first central gas passages. A first nozzle is disposed at the bottom of a first central gas passage along the longitudinal direction of the first central gas passage. The second gas base is disposed upon the first gas base. A plurality of second central gas passages are disposed in the middle of the second gas base. A second gap is disposed between two adjacent second central gas passages. Each of two sides of a second central gas passage along the longitudinal direction of the second central gas passage is provided with a second nozzle. A first gap is aligned with a second gap. The third gas base includes a plurality of third central gas passages. A third central gas passage penetrates through a first gap and a second gap. A third nozzle is disposed at the bottom of a third central gas passage.

In some embodiments, the second gas base is configured to circulate an isolation gas. The isolation gas flows through the second central gas passages, enters the second gaps from the second nozzles, and is ejected from the first gaps. The isolation gas, for example, may be nitrogen.

In some embodiment, the first gas base and the third gas base are both configured to circulate reaction gases and carrier gases. One reaction gas flows through the first central gas passages and is ejected from the first nozzles. Another reaction gas flows through the third central gas passages and is ejected from the third nozzles. The reaction gas in the first gas base and the reaction gas in the third gas base may be switched with each other. Reaction gases, for example, may be gallium chloride and $NH_3$.

It is to be noted that the arrangement in which the three gas bases are mutually independent and mutually combined brings about benefits in four aspects. In the first aspect, this arrangement isolates reaction gases effectively and thus prevents reaction gases from being mixed in advance and causing a pre-reaction at a nozzle. In the second aspect, this arrangement simplifies the structure of each gas base, reduces manufacturing difficulty, and provides greater feasibility for actual production and promotion. In the third aspect, this composite structure helps implement the design of a showerhead with an increasing volume, enables a plurality of GaN thick films of 2 to 8 inches to be produced at one time, improves the universality of the showerhead, makes the showerhead meet the requirements of HVPE apparatus of different sizes, and thus facilitates mass production. In the fourth aspect, the design in which different reaction gases are ejected in parallel in the same direction makes the flow field in the reaction chamber homogeneous and stable, makes the distribution of groups III-V gases more homogeneous, and reduces the product deposition at the showerhead.

In growing GaN thick films through hydride vapor phase epitaxy (HVPE), the showerhead is mainly used for isolating and transmitting various reaction gases required in the process of growth. In this process, the structure at a nozzle of the showerhead directly affects the flow field and the concentration field formed after each source gas enters the HVPE reaction chamber, and directly affects the occurrence of parasitism reaction at the nozzle. Additionally, when GaN is grown in an HVPE apparatus, to prevent an epitaxial wafer from cracking, the temperature is typically not lower than 1000° C. Moreover, HCl gas, which cannot contact metal, occurs in the process of GaN growth. Accordingly, the showerhead in an HVPE apparatus of this solution is made of quartz or ceramic. Since quartz and ceramic are fragile materials, a great risk of damage exists in processing, transportation, or use. The showerhead of this solution is designed in a separable combination. The structure is simple and easy to process, and different reaction gases are ejected in the same direction. Accordingly, the flow field in the reaction chamber is stable. Reaction gases in the effective deposition area of the graphite susceptor underneath are mixed homogeneously. The product deposition at a nozzle of the showerhead is little. The showerhead of this solution can produce high-quality GaN monocrystal stably, sustainably, and massively, thus promoting the industrialization of GaN single crystals.

In some embodiments, the number of the first gaps, the number of the second gaps, and the number of the third central gas passages are equal to each other. A third central gas passage is inserted in each set of a first gap and a second gap that are aligned with each other.

In some embodiments, the thickness of a third central gas passage is less than the thickness of a first gap and the thickness of a second gap.

In some embodiments, the first nozzles and the third nozzles are disposed in the same horizontal plane.

In some embodiments, the first nozzles, the second nozzles, and the third nozzles are all strip-shaped linear nozzles. Alternatively, the first nozzles, the second nozzles, and the third nozzles are orifices that are spaced apart linearly.

In some embodiments, all the structures of the linear showerhead are made of quartz or ceramic.

In some embodiments, the first central gas passages are linear tubes and are parallel to each other. The second central gas passages are linear tubes and are parallel to each other. The third central gas passages are sheet tubes and are parallel to each other.

It is to be noted that the arrangement of the linear gas passages contributes to the stability of gas flows and helps improve the homogeneity of the ejected gases.

In some embodiments, a third central passage penetrates through the entire longitudinal direction of a first gap and a second gap. The arrangement in which a third central passage penetrates through the entire longitudinal direction of a first gap and a second gap enlarges the coverage areas of reaction gases, improves the distribution homogeneity of reaction gases, and thus enhances the production efficiency of GaN.

In some embodiments, the first central gas passages, the second central gas passages, and the third central gas passages are parallel to each other.

It is to be noted that the arrangement in which three groups of central gas passages are parallel to each other reduces the assembly difficulty of the three gas bases, contributes to the regularity of the gas passages formed by the first gaps and the second gaps, and thus improves the stability of gas flows.

In some embodiments, the widths of all first gaps are equal to each other. The widths of all second gaps are equal to each other. The width of a first gap is equal to the width of a second gap. A third central gas passage is disposed at the center of a first gap and a second gap.

It is to be noted that the arrangement in which the width of a first gap is equal to the width of a second gap and in which a third central gas passage is disposed at the center of a first gap and a second gap makes the gas passages inside the showerhead more regular and more homogeneous in size, and thus makes the gas flows ejected from each position more homogeneous and more stable.

In some embodiments, the first central gas passages are circular, elliptical, parallelogrammatic, triangular, trapezoidal, or pentagonal.

The second central gas passages are circular, elliptical, parallelogrammatic, triangular, trapezoidal, or pentagonal.

In some embodiments, the first central gas passages are circular or rectangular. The second central gas passages are circular or rectangular.

In some embodiments, a deflector is disposed at the bottom of a first central gas passage. A first nozzle is disposed at a first end of the deflector. A second end of the deflector is connected to the first central gas passage.

In some embodiments, a deflector includes two inner-arc stop pieces that are disposed symmetrically.

It is to be noted that the arrangement of the deflectors enables that the gases are more homogeneous and more stable when reaching the first nozzles.

In some embodiments, the first gas base includes a first peripheral gas passage. The first central gas passages are disposed on an inner side of the first peripheral gas passage. The ends of the first central gas passages are in communication with the first peripheral gas passage.

The second gas base includes a second peripheral gas passage. The second central gas passages are disposed on an inner side of the second peripheral gas passage. The ends of the second central gas passages are in communication with the second peripheral gas passage.

In some embodiments, the first peripheral gas passage is a circular ring tube. The first central gas passages are secured on the inner sidewall of the circular ring tube. The second peripheral gas passage is a circular ring tube. The second central gas passages are secured on the inner sidewall of the circular ring tube.

In some embodiments, the thickness of a first central gas passage is equal to the thickness of the first peripheral gas passage. The thickness of a second central gas passage is equal to the thickness of the second peripheral gas passage.

In some embodiments, the cross-sectional area of the inner passage of the first peripheral gas passage is larger than the cross-sectional area of the inner passage of a first central gas passage. The cross-sectional area of the inner passage of the second peripheral gas passage is larger than the cross-sectional area of the inner passage of a second central gas passage. The arrangement in which the first peripheral gas passage and the second peripheral gas passage have relatively large cross-sectional areas enables the gases to flow from large cavities into small cavities. Accordingly, the gases ejected from the first nozzles and the second nozzles have more homogeneous pressures, contributing to the formation of a homogeneous concentration field and thus improving crystalline quality.

In some embodiments, a first central gas passage includes a first inner tube and a first outer tube. Each first outer tube is sleeved outside a first inner tube. The two ends of a first inner tube are in communication with the first peripheral gas passage. The top of a first inner tube is provided with a first communication opening. A first nozzle is disposed at the bottom of a first outer tube.

Moreover/alternatively, a second central gas passage includes a second inner tube and a second outer tube. Each second outer tube is sleeved outside a second inner tube. The two ends of a second inner tube are in communication with the second peripheral gas passage. The top of a second inner tube and the bottom of the second inner tube are both provided with a second communication opening. Each of two sides of a second outer tube is provided with a second nozzle.

In some embodiments, the axis of the first inner tube overlaps the axis of the first outer tube. The axis of the second inner tube overlaps the axis of the second outer tube.

It is to be noted that the arrangement of a composite gas passage structure including the inner tubes and the outer tubes enables that the gases enter the inner tubes from the peripheral gas passages, then enter the outer tubes from the inner tubes and through the communication openings, and then are ejected from the nozzles on the outer tubes. Such design makes gas flows more homogeneous and more stable.

In some embodiments, a first gas inlet tube is disposed on the sidewall of the first peripheral gas passage. The first gas inlet tube is perpendicular to the first central gas passages.

A second gas inlet tube is disposed on the sidewall of the second peripheral gas passage or at the top of the second peripheral gas passage. The second gas inlet tube is perpendicular to the second central gas passages and located away from positions where the second central gas passages are in communication with the second peripheral gas passage.

It is to be noted that the arrangement in which the gas inlet tubes is located away from positions where the central gas passages are in communication with the peripheral gas passages enables the gas flows entering each central gas passage to be more homogeneous and more stable.

In some embodiments, the third gas base further includes a gas homogenizing cavity. A first end of the gas homogenizing cavity is in communication with the third central gas passages. A second end of the gas homogenizing cavity is provided with a third gas inlet tube.

In some embodiments, a third gas inlet tube and the third central gas passages are disposed on two opposite sides of the gas homogenizing cavity.

In some embodiments, one third gas inlet tube is provided.

In some embodiments, the third central gas passages are disposed at the bottom of the gas homogenizing cavity. A third gas inlet tube is disposed on the sidewall of the gas homogenizing cavity.

In some embodiments, two third gas inlet tubes are provided and are disposed on two sides of the gas homogenizing cavity separately.

It is to be noted that the arrangement of the gas homogenizing cavity enables the gases to enter a large cavity from small cavities and then enter the small cavities. Accordingly, the gases ejected from the third nozzles have more homogeneous pressures, contributing to the formation of a homogeneous concentration field and thus improving crystalline quality.

In some embodiments, the bottom of the gas homogenizing cavity covers the tops of the second gaps.

It is to be noted that the arrangement in which the gas homogenizing cavity covers the tops of the second gaps prevents the gases ejected from the second nozzles from being ejected from the tops of the second gaps, omits an external sealing structure, and thus simplify the entire structure of the apparatus.

The present application provides a linear showerhead for growing GaN. The arrangement in which the three gas bases are mutually independent and mutually combined brings about benefits in four aspects. In the first aspect, this arrangement isolates reaction gases effectively and thus prevents reaction gases from being mixed in advance and causing a pre-reaction at a nozzle. In the second aspect, this arrangement simplifies the structure of each gas base, reduces manufacturing difficulty, and provides greater feasibility for actual production and promotion. In the third aspect, this composite structure helps implement the design of a showerhead with an increasing volume, enables a plurality of GaN thick films of 2 to 8 inches to be produced at one time, improves the universality of the showerhead, makes the showerhead meet the requirements of HVPE apparatus of different sizes, and thus facilitates mass production and promotes the industrialization of GaN single crystals. In the fourth aspect, the design in which different reaction gases are ejected in parallel in the same direction makes the flow field in the reaction chamber homogeneous and stable, enables reaction gases in the effective deposition area on the surface of the operation susceptor to be mixed homogeneously, and reduces product deposition at the showerhead.

BRIEF DESCRIPTION OF DRAWINGS

The present application is described in detail hereinafter according to the drawings and embodiments of the present application.

Figure 1:
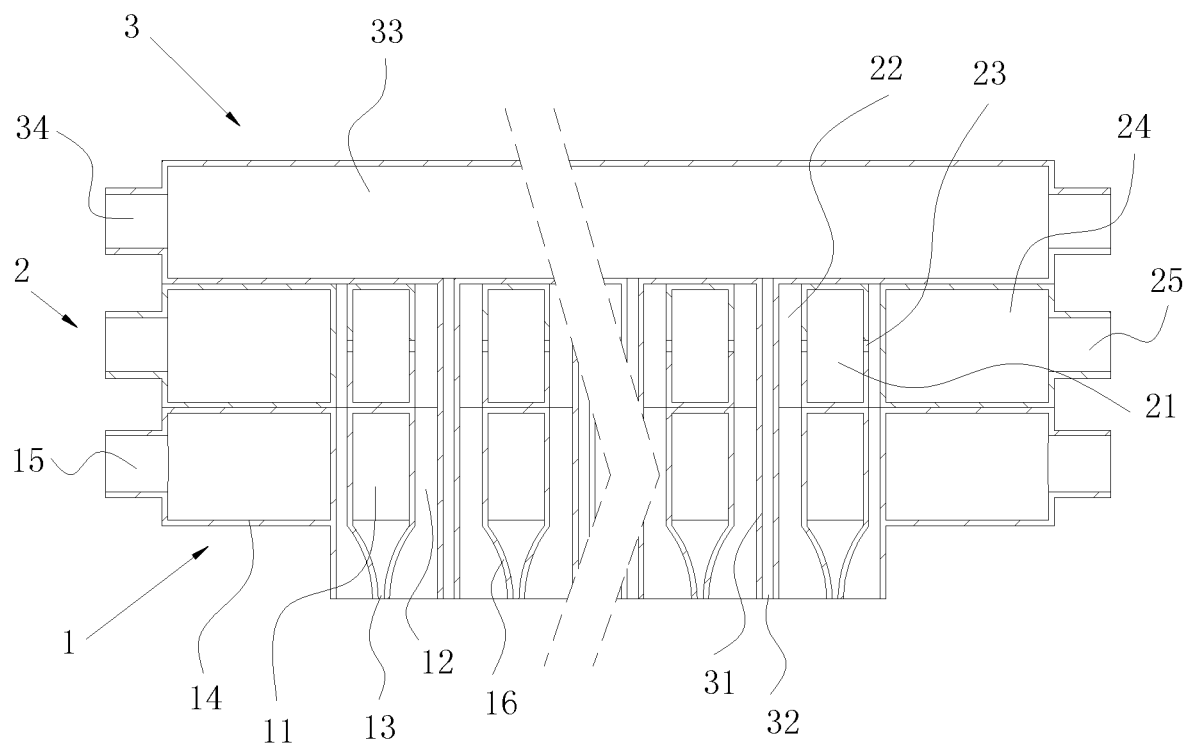
FIG. 1 is a view illustrating the structure of a showerhead according to embodiment one of the present application.
Figure 2:
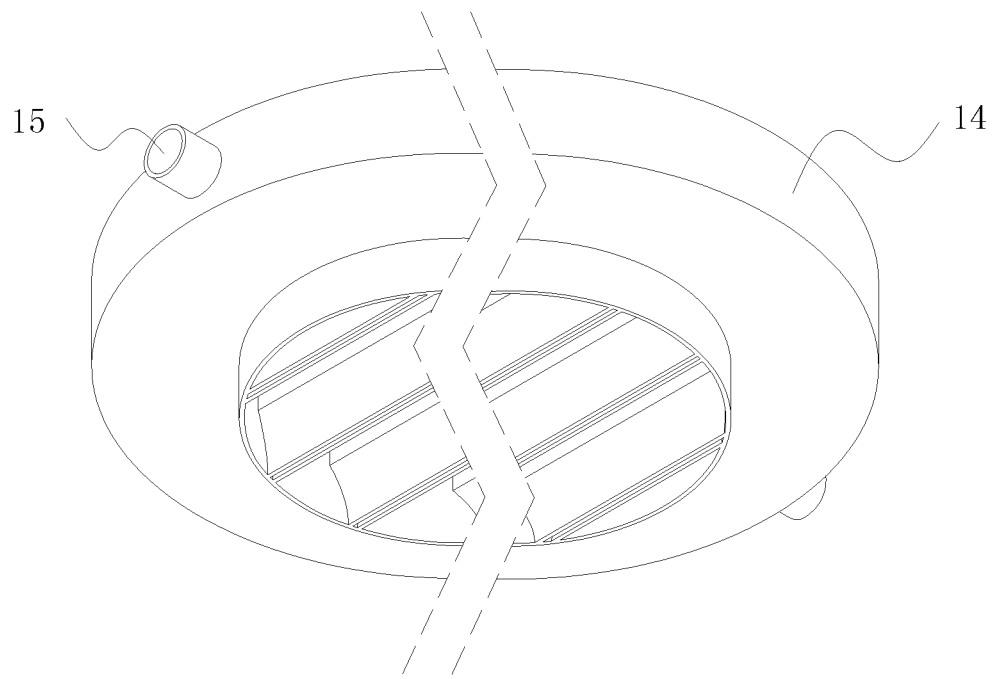
FIG. 2 is a view illustrating the structure of a first gas base according to embodiment one of the present application.
Figure 3:
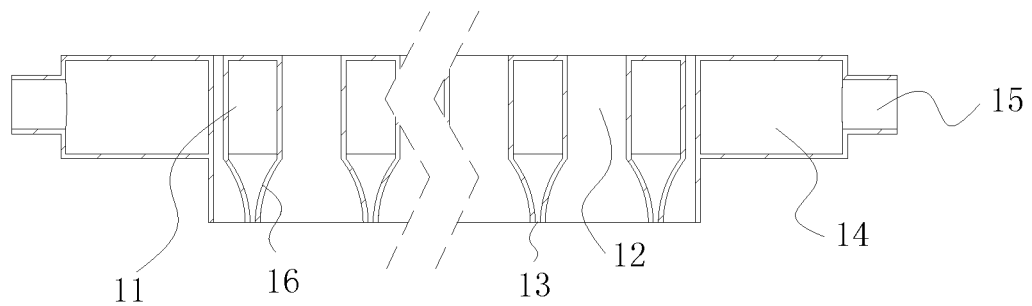
FIG. 3 is a full section view of the first gas base according to embodiment one of the present application.
Figure 4:
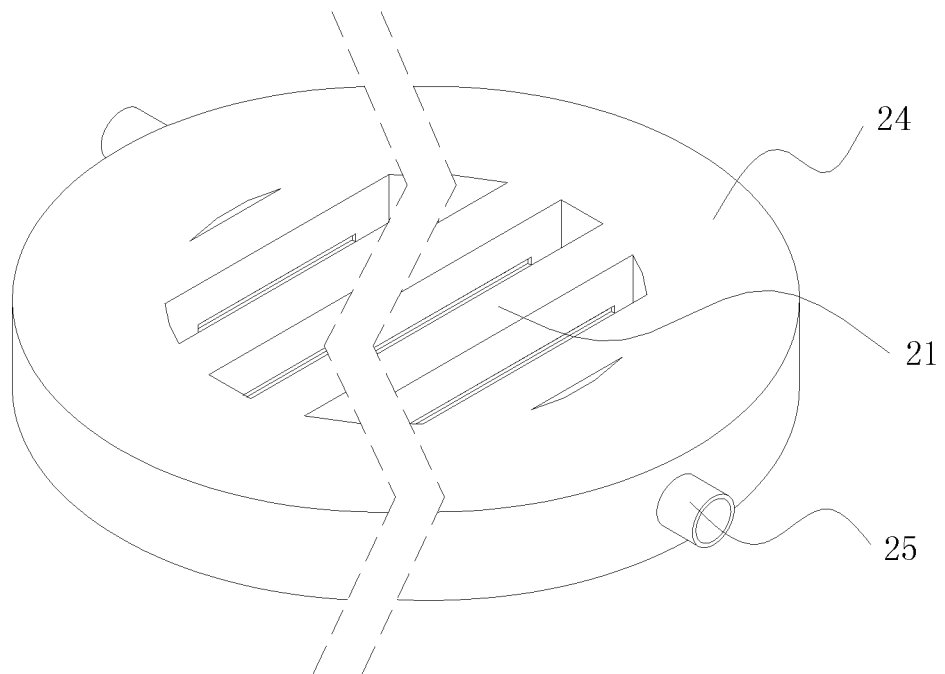
FIG. 4 is a view illustrating the structure of a second gas base according to embodiment one of the present application.
Figure 5:
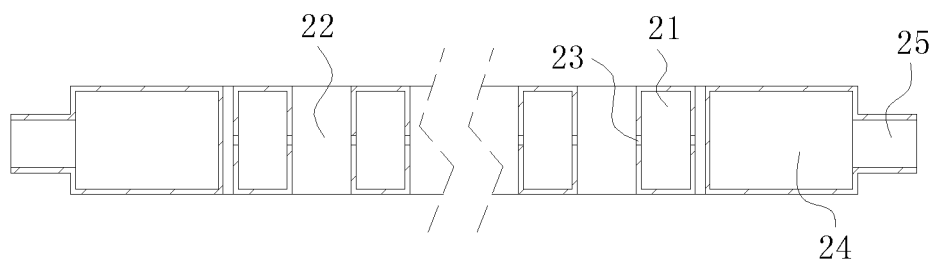
FIG. 5 is a full section view of the second gas base according to embodiment one of the present application.
Figure 6:
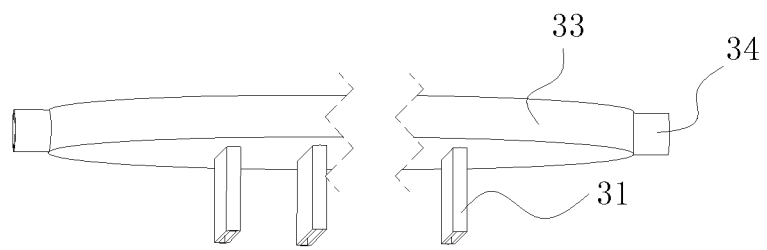
FIG. 6 is a view illustrating the structure of a third gas base according to embodiment one of the present application.
Figure 7:
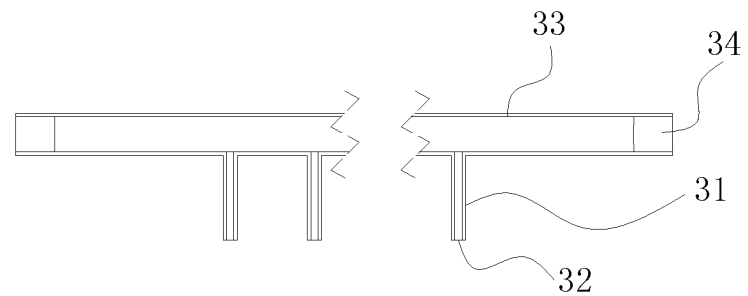
FIG. 7 is a full section view of the third gas base according to embodiment one of the present application.
Figure 8:
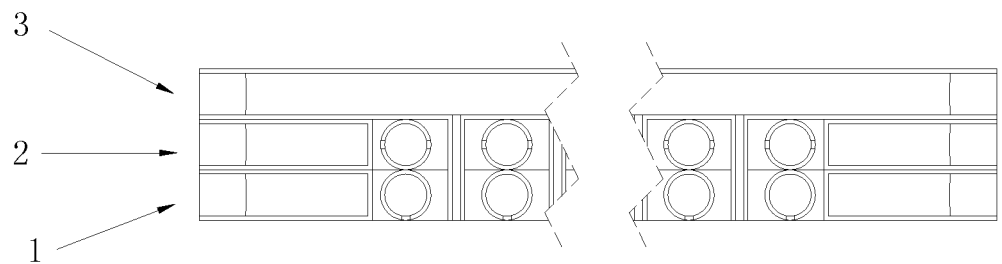
FIG. 8 is a view illustrating the structure of a showerhead according to embodiment four of the present application.
Figure 9:
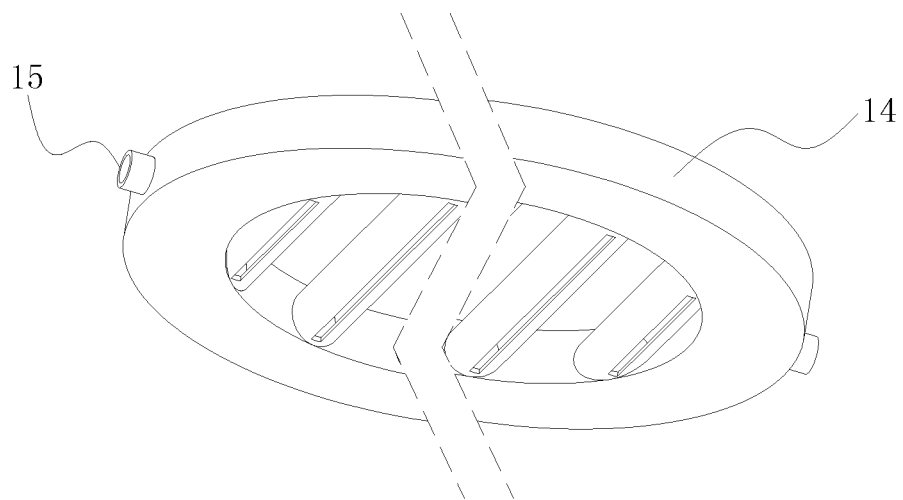
FIG. 9 is a view illustrating the structure of a first gas base according to embodiment four of the present application.
Figure 10:
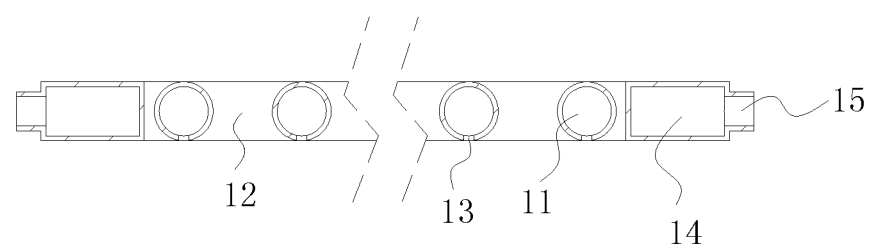
FIG. 10 is a full section view of the first gas base according to embodiment four of the present application.
Figure 11:
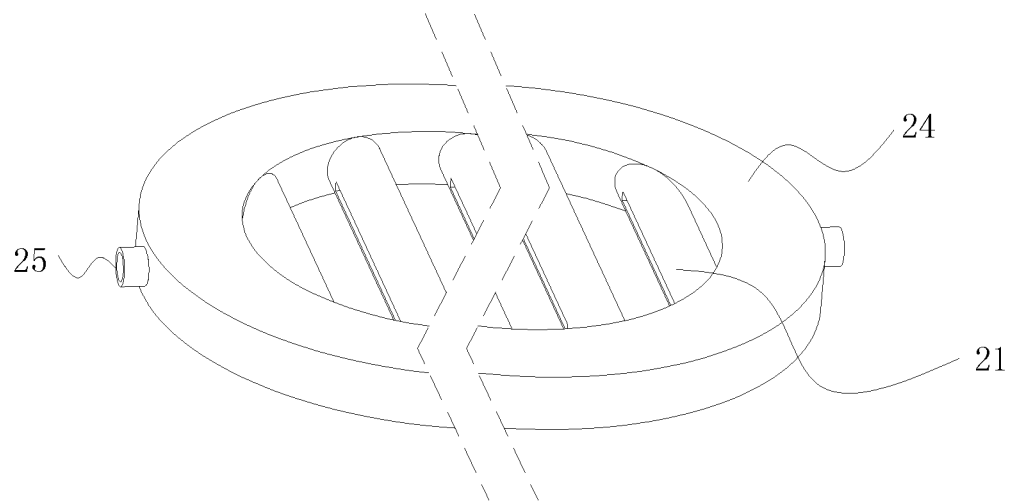
FIG. 11 is a view illustrating the structure of a second gas base according to embodiment four of the present application.
Figure 12:
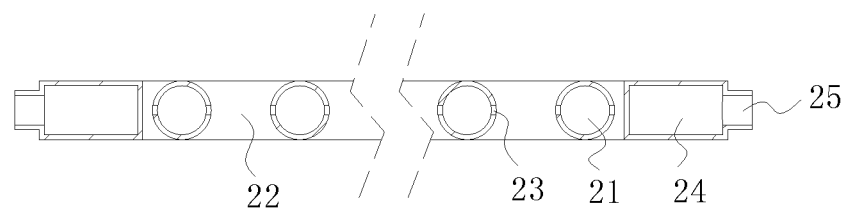
FIG. 12 is a full section view of the second gas base according to embodiment four of the present application.
Figure 13:
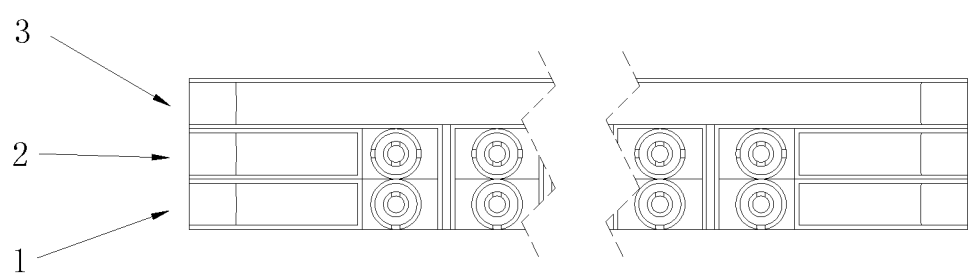
FIG. 13 is a view illustrating the structure of a showerhead according to embodiment five of the present application.
Figure 14:
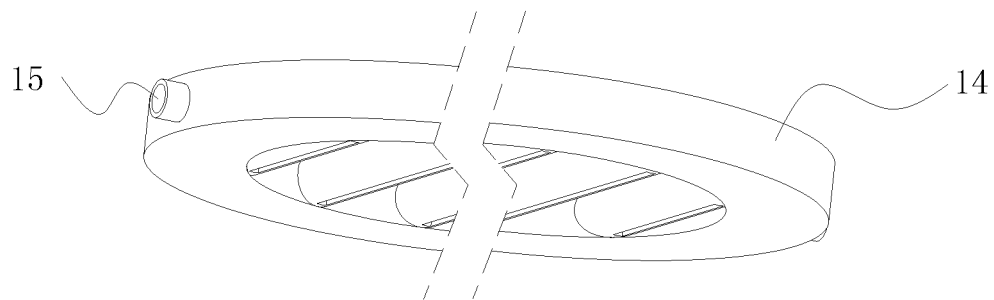
FIG. 14 is a view illustrating the structure of a first gas base according to embodiment five of the present application.
Figure 15:
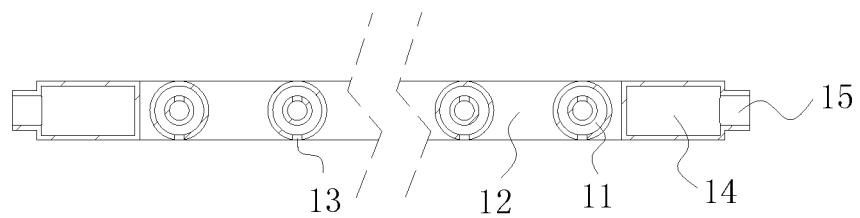
FIG. 15 is a full section view of the first gas base according to embodiment five of the present application.
Figure 16:
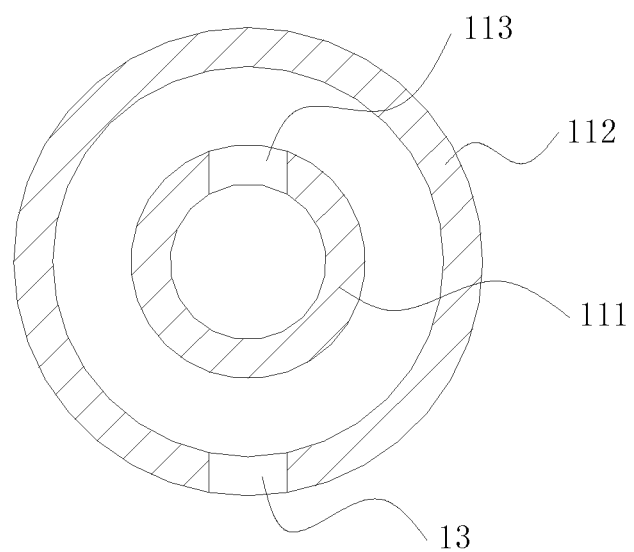
FIG. 16 is a full section view of a first central gas passage according to embodiment five of the present application.
Figure 17:
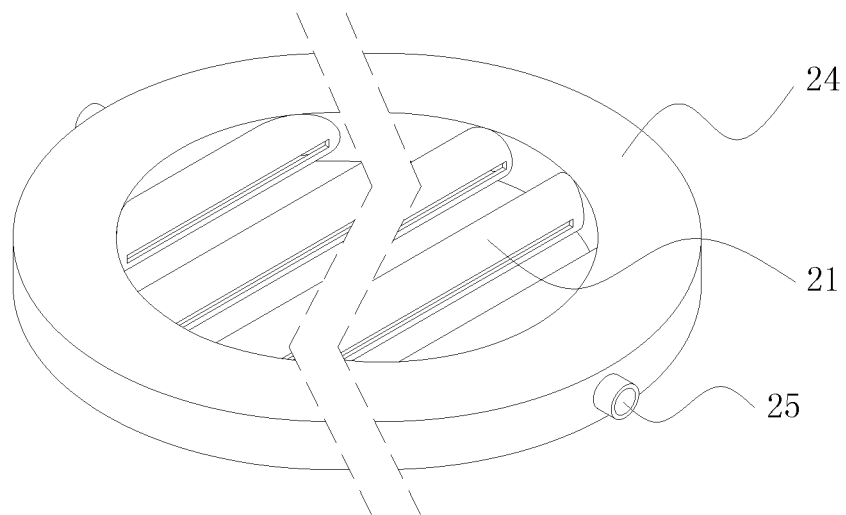
FIG. 17 is a view illustrating the structure of a second gas base according to embodiment five of the present application.
Figure 18:
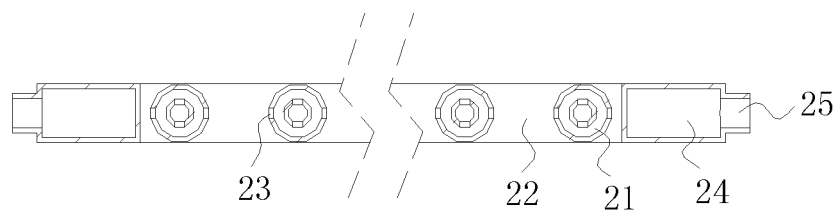
FIG. 18 is a full section view of the second gas base according to embodiment five of the present application.
Figure 19:
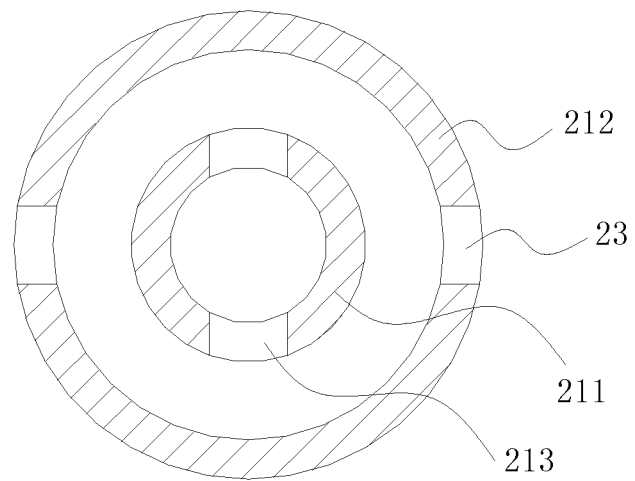
FIG. 19 is a full section view of a second central gas passage according to embodiment five of the present application.
Figure 20:
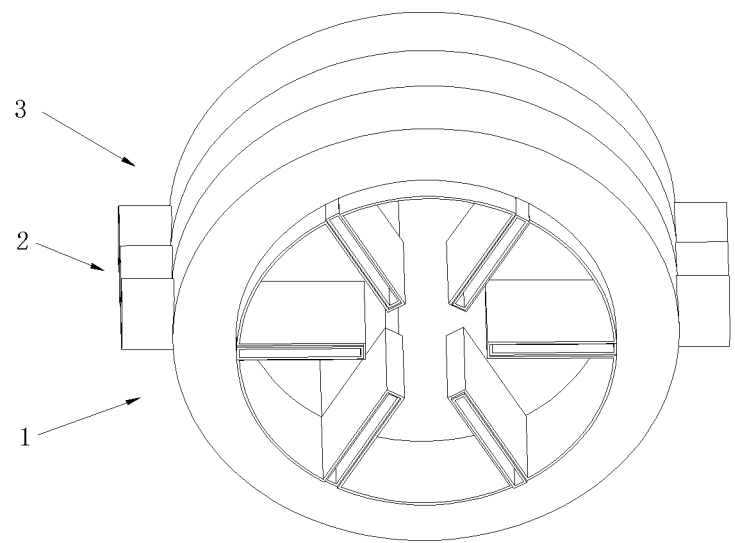
FIG. 20 is a view illustrating the structure of a showerhead according to embodiment six of the present application.
Figure 21:
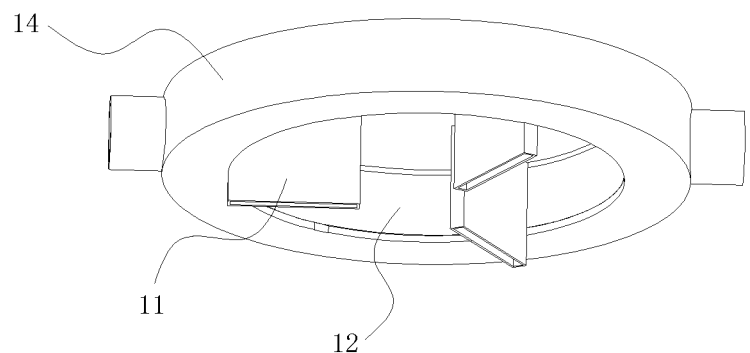
FIG. 21 is a view illustrating the structure of a first gas base according to embodiment six of the present application.
Figure 22:
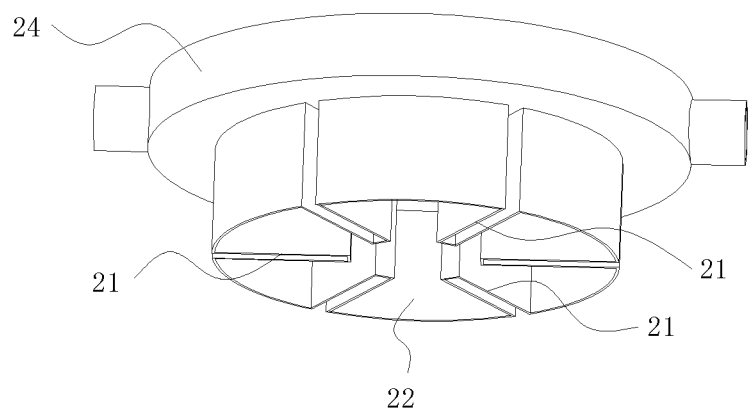
FIG. 22 is a view illustrating the structure of a second gas base according to embodiment six of the present application.
Figure 23:
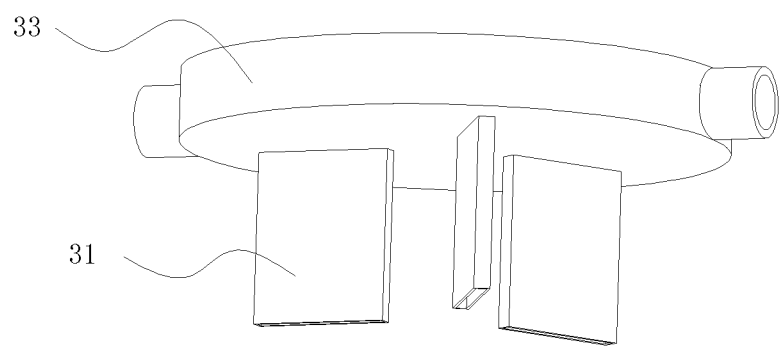
FIG. 23 is a view illustrating the structure of a third gas base according to embodiment six of the present application.

REFERENCE LIST 1 first gas base
11 first central gas passage
111 first inner tube
112 first outer tube
113 first communication opening
12 first gap
13 first nozzle
14 first peripheral gas passage
15 first gas inlet tube
16 deflector
2 second gas base
21 second central gas passage
211 second inner tube
212 second outer tube
213 second communication opening
22 second gap
23 second nozzle
24 second peripheral gas passage
25 second gas inlet tube
3 third gas base
31 third central gas passage
32 third nozzle
33 gas homogenizing cavity
34 third gas inlet tube

DETAILED DESCRIPTION

The solutions of the present application are further described hereinafter through embodiments in conjunction with the drawings.

Embodiment One

FIGS. 1 to 7 show a linear showerhead for growing GaN. All the structures of the linear showerhead are made of quartz or ceramic. The linear showerhead includes a first gas base 1, a second gas base 2, and a third gas base 3 that are sequentially connected from bottom to top. The top of the first gas base 1 is attached to the bottom of the second gas base 2. A plurality of first central gas passages 11 are disposed in the middle of the first gas base 1. A first gap 12 is disposed between two adjacent first central gas passages 11. A first nozzle 13 is disposed at the bottom of a first central gas passage 11 along the longitudinal direction of the first central gas passage 11. The second gas base 2 is disposed on the first gas base 1. A plurality of second central gas passages 21 are disposed in the middle of the second gas base 2. A second gap 22 is disposed between two adjacent second central gas passages 21. Each of two sides of a second central gas passage 21 along the longitudinal direction of the second central gas passage 21 is provided with a second nozzle 23. A first gap 12 is aligned with a second gap 22. The third gas base 3 includes a plurality of third central gas passages 31. A third central gas passage 31 penetrates through a first gap 12 and a second gap 22. A third nozzle 32 is disposed at the bottom of a third central gas passage 31. The first nozzles 13 and the third nozzles 32 are disposed in the same horizontal plane. The first nozzles 13, the second nozzles 23, and the third nozzles 32 are all strip-shaped linear nozzles. Of course, in other embodiments, the first nozzles 13, the second nozzles 23, and the third nozzles 32 may be orifices that are spaced apart linearly. Alternatively, one or two of the first nozzles 13, the second nozzles 23, and the third nozzles 32 are strip-shaped linear nozzles; the remaining two or one are orifices.

The second gas base 2 of this embodiment is configured to circulate the isolation gas nitrogen. The isolation gas flows through the second central gas passages 21, enters the second gaps 22 from the second nozzles 23, and is ejected from the first gaps 12. The first gas base 1 is configured to circulate the reaction gas gallium chloride and the carrier gas. The reaction gas flows through the first central gas passages 11 and is ejected from the first nozzles 13. The third gas base 3 is configured to circulate the reaction gas $NH_3$ and the carrier gas. The reaction gas flows through the third central gas passages 31 and is ejected from the third nozzles 32. In other embodiments, the reaction gas in the first gas base 1 and the reaction gas in the third gas base 3 may be switched with each other. That is, the first gas base 1 is configured to circulate the reaction gas $NH_3$ and the carrier gas; the third gas base 3 is configured to circulate the reaction gas gallium chloride and the carrier gas. After the gas passages of reaction gases are switched, the relative outlets of the two source gases of gallium chloride and $NH_3$ change, causing the flow field and the concentration field in the reaction chamber to change. Accordingly, such switching can increase the control range of the GaN growth process In this embodiment, the arrangement in which the three gas bases of the showerhead are mutually independent and mutually combined and in which the gases in each gas base may be controlled separately brings about benefits in four aspects. In the first aspect, isolates reaction gases effectively and thus prevents reaction gases from being mixed in advance and causing a pre-reaction at a nozzle. In the second aspect, this arrangement simplifies the structure of each gas base, reduces manufacturing difficulty, and provides greater feasibility for actual production and promotion. In the third aspect, this composite structure helps implement the design of a showerhead with an increasing volume, enables a plurality of GaN thick films of 2 to 8 inches to be produced at one time, improves the universality of the showerhead, makes the showerhead meet the requirements of HVPE apparatus of different sizes, and thus facilitates mass production. In the fourth aspect, the design in which different reaction gases are ejected in parallel in the same direction makes the flow field in the reaction chamber homogeneous and stable and reduces the product deposition at the showerhead.

In growing GaN thick films through hydride vapor phase epitaxy (HVPE), the showerhead is mainly used for isolating and transmitting various reaction gases required in the growth process. In this process, the structure at a nozzle of the showerhead directly affects the flow field and the concentration field formed after each source gas enters the HVPE reaction chamber, and directly affects the occurrence of parasitism reaction at the nozzle. Additionally, when GaN is grown on an HYPE device, to prevent an epitaxial wafer from cracking, the temperature is typically not lower than 1000° C. Moreover, HCl gas, which cannot contact metal, occurs in the process of GaN growth. Accordingly, the showerhead in an HVPE apparatus of this solution is made of quartz or ceramic. Since quartz and ceramic are fragile materials, a great risk of damage exists in processing, transportation, or use. The showerhead of this solution is designed in a separable combination. The structure is simple and easy to process, and different reaction gases are ejected in the same direction. Accordingly, the flow field in the reaction chamber is stable.

Reaction gases in the effective deposition area of the graphite susceptor underneath are mixed homogeneously. The deposition at a nozzle of the showerhead is little. The showerhead of this solution can produce high-quality GaN single crystals stably, sustainably, and massively, thus promoting the industrialization of GaN single crystals.

In this embodiment, the first gas base 1 includes a first peripheral gas passage 14. The first central gas passages 11 are disposed on an inner side of the first peripheral gas passage 14. The ends of the first central gas passages 11 communicate with the first peripheral gas passage 14. The second gas base 2 includes a second peripheral gas passage 24. The second central gas passages 21 are disposed on an inner side of the second peripheral gas passage 24. The ends of the second central gas passages 21 communicate with the second peripheral gas passage 24. The first peripheral gas passage 14 is a circular ring tube. The first central gas passages 11 are secured on the inner sidewall of the circular ring tube. The second peripheral gas passage 24 is a circular ring tube. The second central gas passages 21 are secured on the inner sidewall of the circular ring tube. The thickness of a first central gas passage 11 is equal to the thickness of the first peripheral gas passage 14. The thickness of a second central gas passage 21 is equal to the thickness of the second peripheral gas passage 24.

A first gas inlet tube 15 is disposed on the sidewall of the first peripheral gas passage 14. The first gas inlet tube 15 is perpendicular to the first central gas passages 11. A second gas inlet tube 25 is disposed on the sidewall of the second peripheral gas passage 24. The second gas inlet tube 25 is perpendicular to the second central gas passages 21 and located away from positions where the second central gas passages 21 communicate with the second peripheral gas passage 24. The arrangement in which the gas inlet tubes is located away from positions where the central gas passages communicate with the peripheral gas passages enables the gas flows entering each central gas passage to be more uniform and more stable. In other embodiments, the second gas inlet tube 25 may also be disposed at the top of the second peripheral gas passage 24.

In this embodiment, the third gas base 3 further includes a gas homogenizing cavity 33. The bottom of the gas homogenizing cavity 33 communicates with the third central gas passages 31. Two third gas inlet tubes 34 are disposed on the sidewall of the gas homogenizing cavity 33. In other embodiment, a third gas inlet tube 34 and the third central gas passages 31 are disposed on two opposite sides of the gas homogenizing cavity 33. That is, the third gas inlet tube 34 is disposed at the top of the gas homogenizing cavity; the third central gas passages 31 are disposed at the bottom of the gas homogenizing cavity; one third gas inlet tube 34 is provided. In this embodiment, the arrangement of the gas homogenizing cavity 33 enables the gases to enter a large cavity from small cavities and then enter the small cavities. Accordingly, the gases ejected from the third nozzles 33 have more homogeneous pressures, contributing to the formation of a homogeneous concentration field and thus improving crystalline quality.

The bottom of the gas homogenizing cavity 33 is attached to the second gas base 2. The bottom of the gas homogenizing cavity 33 covers the tops of the second gaps 22. This arrangement prevents the gases ejected from the second nozzles 23 from being ejected from the tops of the second gaps 22, omits an external sealing structure, and thus simplifies the entire structure of the apparatus.

In this embodiment, the number of the first central gas passages 11 and the number of the second central gas passages 21 are both four. The number of the first gaps 12 and the number of the second gaps 22 are both three. The number of the third central gas passages 31 is also three. The number of the first central gas passages 11, the number of the second central gas passages 21, the number of the third central gas passages 31, and the like are illustrated using double dashed lines for separation in the drawings. The numbers may be added or subtracted according to actual needs. Each first gap 12 is aligned with a second gap 22. A third central gas passage 31 is inserted in each set of a first gap 12 and a second gap 22 that are aligned with each other. The first central gas passages 11 are linear tubes and are parallel to each other. The second central gas passages 21 are linear tubes and are parallel to each other. The third central gas passages 31 are sheet tubes and are parallel to each other. The thickness of a third central gas passage 31 is less than the thickness of a first gap 12 and the thickness of a second gap 22. The arrangement of the linear gas passages contributes to the stability of gas flows and helps improve the uniformity of the ejected gases. In this embodiment, a third central passage 31 penetrates through the entire longitudinal direction of a first gap 12 and a second gap 22. Such design enlarges the coverage areas of reaction gases, improves the distribution uniformity of reaction gases, and thus enhances the production efficiency of GaN.

In this embodiment, the first central gas passages 11, the second central gas passages 21, and the third central gas passages 31 are parallel to each other. The central gas passages parallel to each other reduce the assembly difficulty of the three gas bases, contribute to the regularity of the gas passages formed by the first gaps 12 and the second gaps 22, and thus improve the stability of gas flows. The widths of the three first gaps 12 are equal to each other. The widths of the three second gaps 22 are equal to each other. The width of a first gap 12 is equal to the width of a second gap 22. A third central gas passage 31 is disposed at the center of a first gap 12 and a second gap 22. The arrangement in which the width of a first gap 12 is equal to the width of a second gap 22 and in which the third central gas passages 31 are disposed at the center of the gaps makes the gas passages inside the showerhead more regular and homogeneous in size, and thus makes the gas flows ejected from each position more homogeneous and more stable.

In this embodiment, the first central gas passages 11 and the second central gas passages 21 are both rectangular. A deflector 16 is disposed at the bottom of a first central gas passage 11. A first nozzle 13 is disposed at a first end of the deflector 16. A second end of the deflector 16 is connected to the first central gas passage 11. A deflector 16 includes two inner-arc stop pieces that are disposed symmetrically. The arrangement of the deflectors 16 enables that the gases are more homogeneous and more stable when reaching the first nozzles 13.

A rotatable susceptor is disposed under the showerhead. The showerhead creates a homogeneous concentration field of reaction gases on the surface of the susceptor so that high-quality crystallization is implemented.

Embodiment Two

The differences between this embodiment and embodiment one are described below.

In this embodiment, the cross-sectional area of the inner passage of the first peripheral gas passage 14 is larger than the cross-sectional area of the inner passage of a first central gas passage 11. The cross-sectional area of the inner passage of the second peripheral gas passage 24 is larger than the cross-sectional area of the inner passage of a second central gas passage 21. The arrangement in which the first peripheral gas passage 14 and the second peripheral gas passage 24 have relatively large cross-sectional areas enables gases to flow from large cavities into small cavities. Accordingly, the gases ejected from the first nozzles 13 and the second nozzles 23 have more homogeneous pressures, contributing to the formation of a homogeneous concentration field and thus improving crystalline quality.

Embodiment Three

The differences between this embodiment and embodiment one are described below.

The number of the first central gas passages 11 and the number of the second central gas passages 21 are both five. The number of the first gaps 12 and the number of the second gaps 22 are both four. The number of the third central gas passages is also four. In other embodiments, the number of the first central gas passages 11 and the number of the second central gas passages 21 may be two, three, six, or more.

Embodiment Four

The differences between this embodiment and embodiment one are described below.

As shown in FIGS. 8 to 12, the first central gas passages 11 and the second central gas passages 21 are both circular. The number of the first central gas passages 11, the number of the second central gas passages 21, the number of the third central gas passages 31, and the like are illustrated using double dashed lines for separation in the drawings. The numbers may be added or subtracted according to actual needs. In other embodiments, the first central gas passages 11 and the second central gas passages 21 may also be elliptical, parallelogrammatic, triangular, trapezoidal, or pentagonal. In other embodiments, the shape of the first central gas passages 11 may also be different from the shape of the second central gas passages 21. For example, the first central gas passages 11 are rectangular; the second central gas passages 21 are circular.

Embodiment Five

The differences between this embodiment and embodiment four are described below.

As shown in FIGS. 13 to 19, a first central gas passage 11 includes a first inner tube 111 and a first outer tube 112. Each first outer tube 112 is sleeved outside a first inner tube 111. The first outer tubes 112 and the first inner tubes 111 are concentric tubes. The two ends of a first inner tube 111 communicate with the first peripheral gas passage 14. The top of a first inner tube 111 is provided with a first communication opening 113. A first nozzle 13 is disposed at the bottom of a first outer tube 112. A second central gas passage 21 includes a second inner tube 211 and a second outer tube 212. Each second outer tube 212 is sleeved outside a second inner tube 211. The second outer tubes 212 and the second inner tubes 211 are concentric tubes. The two ends of a second inner tube 211 communicate with the second peripheral gas passage 24. The top of a second inner tube 211 and the bottom of the second inner tube 211 are both provided with a second communication opening 213. Each of two sides of a second outer tube 212 is provided with a second nozzle 23. In this embodiment, the first communication openings 113 are elongated openings extending along the longitudinal direction of the first inner tubes 111. The second communication openings 213 are elongated openings extending along the longitudinal direction of the second inner tubes 211. The number of the first central gas passages 11, the number of the second central gas passages 21, the number of the third central gas passages 31, and the like are illustrated using double dashed lines for separation in the drawings. The numbers may be added or subtracted according to actual needs. Of course, in other embodiments, the first communication openings 113 and the second communication openings 213 may each be three circular openings spaced apart linearly. Alternatively, of the first communication openings 113 and the second communication openings 213, one are elongated openings extending along the longitudinal direction and the other are circular openings. In this solution, the arrangement of a composite gas passage structure including the inner tubes and the outer tubes enables that the gases enter the inner tubes from the peripheral gas passages, then enter the outer tubes from the inner tubes and through the communication openings, and then are ejected from the nozzles on the outer tubes. Such design makes gas flows more homogeneous and more stable.

Embodiment Six

The differences between this embodiment and embodiment one are described below.

Figure 24:
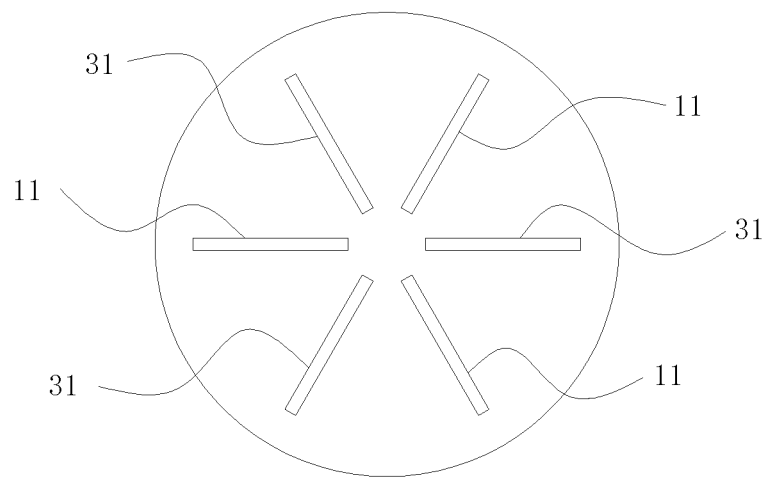
FIG. 24 is a view illustrating the planar sheet structure of a first central gas passage and a third central gas passage according to embodiment six of the present application.
Figure 25:
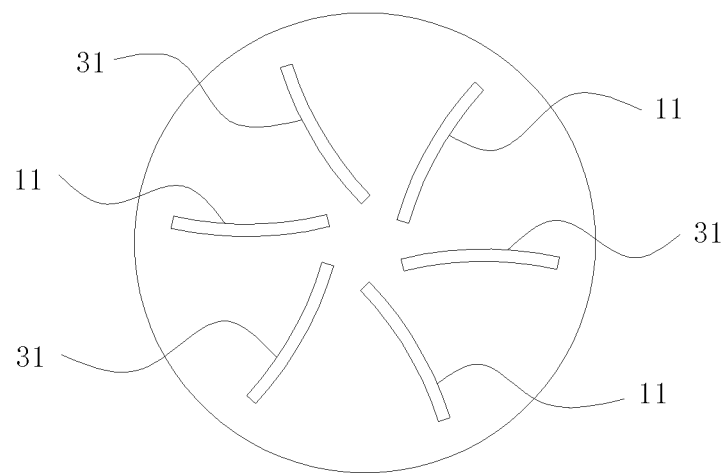
FIG. 25 is a view illustrating the arcuate sheet structure of a first central gas passage and a third central gas passage according to embodiment six of the present application.

As shown in FIGS. 20 to 25, the first gas base 1 includes first central gas passages 11 and a first peripheral gas passage 14. The first central gas passages 11 are disposed on an inner side of the first peripheral gas passage 14. The ends of the first central gas passages 11 communicate with the first peripheral gas passage 14. The first peripheral gas passage 14 is a circular ring tube. The number of the first central gas passages 11 is three. A first end of a first central gas passage 11 is secured on the inner sidewall of the circular ring tube. A second end of a first central gas passage 11 hangs in the air. The three first central gas passages 11 are in an equiangular distribution on an inner side of the first peripheral gas passage 14 along the circumferential direction. In this embodiment, the first central gas passages 11 are sheet groove structures. As shown in FIGS. 24 and 25, the first central gas passages 11 may be planar sheet structures or arcuate sheet structures. In other embodiments, the first central gas passages 11 may also be sector structures or sector-ring groove structures. The number of the first central gas passages 11 may not be three.

The second gas base 2 includes second central gas passages 21 and a second peripheral gas passage 24. Six passage grooves are disposed inside the second peripheral gas passage 24. Three of the six passage grooves are spaced apart and communicate with the second peripheral gas passage 24. The three passage grooves form three second central gas passages 21. The other three passage grooves are inserted between three first central gas passages 11 and form the giving way passage of three central gas passages 31. The first central gas passages 11 are engaged in the upper ends inside the second central gas passages 21. The upper ends of the second central gas passages 21 are connected to the second peripheral gas passage 24. The three giving way passages are disposed inside the first gaps 12 between the first central gas passages 11. The second nozzles are disposed on two sides of the upper ends of the second central gas passages 21. The isolation gases enter the second central gas passages 21 from the second peripheral gas passage 24. Since the lower ends of the second central gas passages 21 are blocked by the first central gas passages 11 and the upper ends of the second central gas passages 21 are blocked by the gas homogenizing cavity 33 of the third gas base 3, the isolation gas is ejected from the second nozzles to the second gaps 22 and then reach the first gaps 12 to implement the isolation of reaction gases.

The third gas base 3 further includes a gas homogenizing cavity 33. The bottom of the gas homogenizing cavity 33 communicates with the third central gas passages 31. The bottom of the gas homogenizing cavity 33 is attached to the second gas base 2. The bottom of the gas homogenizing cavity 33 covers the tops of the second gaps 22. This arrangement prevents the gases ejected from the second nozzles from being ejected from the tops of the second gaps 22, omits an external sealing structure, and thus simplifies the entire structure of the apparatus. In this embodiment, the third central gas passages 31 are sheet groove structures. As shown in FIGS. 24 and 25, the third central gas passages 31 may be planar sheet structures or arcuate sheet structures. The shape of the three second central gas passages 21 is the same as the shape of the first central gas passages 11. The shape of the three giving way passages is the same as the shape of the third central gas passages 31. In other embodiments, the third central gas passages may also be sector structures or sector-ring groove structures. Of course, the third central gas passages must be able to be inserted into the first gaps between the first central gas passages. Additionally, the number of the third central gas passages is not three.

The terms "first", "second", and "three" used herein are only for ease of description and have no special meanings.

What is claimed is:

1. A linear showerhead for growing GaN, comprising a first gas base, a second gas base, and a third gas base,
    wherein a plurality of first central gas passages are disposed in a middle of the first gas base, a first gap is disposed between two adjacent ones of the plurality of first central gas passages, and a first nozzle is disposed at a bottom of one of the plurality of first central gas passages along a longitudinal direction of the one of the plurality of first central gas passages;
    wherein the second gas base is disposed upon the first gas base, a plurality of second central gas passages are disposed in a middle of the second gas base, a second gap is disposed between two adjacent ones of the plurality of second central gas passages, each of two sides of one of the plurality of second central gas passages along a longitudinal direction of the one of the plurality of second central gas passages is provided with a second nozzle, and the first gap is aligned with the second gap;
    wherein the third gas base comprises a plurality of third central gas passages, one of the plurality of third central gas passages penetrates through the first gap and the second gap, and a third nozzle is disposed at a bottom of the one of the plurality of third central gas passages; and
    wherein each of the plurality of second central gas passages communicates with the respective first gap by the respective second nozzle.

2. The linear showerhead for growing GaN according to claim 1, wherein the plurality of first central gas passages are linear tubes and are parallel to each other, the plurality of second central gas passages are linear tubes and are parallel to each other, and the plurality of third central gas passages are sheet tubes and are parallel to each other.

3. The linear showerhead for growing GaN according to claim 2, wherein widths of all first gaps are equal to each other, widths of all second gaps are equal to each other, a width of the first gap is equal to a width of the second gap, and the one of the plurality of third central gas passages is disposed at a center of the first gap and the second gap.

4. The linear showerhead for growing GaN according to claim 1, wherein the plurality of first central gas passages are circular, elliptical, parallelogrammatic, triangular, trapezoidal, or pentagonal; and
    wherein the plurality of second central gas passages are circular, elliptical, parallelogrammatic, triangular, trapezoidal, or pentagonal.

5. The linear showerhead for growing GaN according to claim 1, wherein a deflector is disposed at the bottom of the one of the plurality of first central gas passages, the first nozzle is disposed at a first end of the deflector, and a second end of the deflector is connected to the one of the plurality of first central gas passages.

6. The linear showerhead for growing GaN according to claim 1, wherein the first gas base comprises a first peripheral gas passage, the plurality of first central gas passages are disposed on an inner side of the first peripheral gas passage, and ends of the plurality of first central gas passages are in communication with the first peripheral gas passage; and
    wherein the second gas base comprises a second peripheral gas passage, the plurality of second central gas passages are disposed on an inner side of the second peripheral gas passage, and ends of the plurality of second central gas passages are in communication with the second peripheral gas passage.

7. The linear showerhead for growing GaN according to claim 6, wherein the one of the plurality of first central gas passages comprises a first inner tube and a first outer tube, the first outer tube is sleeved outside the first inner tube, two ends of the first inner tube are in communication with the first peripheral gas passage, a top of the first inner tube is provided with a first communication opening, and the first nozzle is disposed at a bottom of the first outer tube.

8. The linear showerhead for growing GaN according to claim 6, wherein a first gas inlet tube is disposed on a sidewall of the first peripheral gas passage, and the first gas inlet tube is perpendicular to the plurality of first central gas passages; and
    wherein a second gas inlet tube is disposed on a sidewall of the second peripheral gas passage or at a top of the second peripheral gas passage, the second gas inlet tube is perpendicular to the plurality of second central gas passages and located away from positions where the plurality of second central gas passages are communication with the second peripheral gas passage.

9. The linear showerhead for growing GaN according to claim 1, wherein the third gas base further comprises a gas homogenizing cavity, wherein a first end of the gas homogenizing cavity is in communication with the plurality of third central gas passages, and a second end of the gas homogenizing cavity is provided with a third gas inlet tube.

10. The linear showerhead for growing GaN according to claim 9, wherein a bottom of the gas homogenizing cavity covers a top of the second gap.

11. The linear showerhead for growing GaN according to claim 6, wherein the one of the plurality of second central gas passages comprises a second inner tube and a second outer tube, the second outer tube is sleeved outside the second inner tube, two ends of the second inner tube are in communication with the second peripheral gas passage, a top of the second inner tube and a bottom of the second inner tube are both provided with a second communication opening, and on each of two sides of the second outer tube are provided with the second nozzle.

12. The linear showerhead for growing GaN according to claim 6, wherein the one of the plurality of first central gas passages comprises a first inner tube and a first outer tube, the first outer tube is sleeved outside the first inner tube, two ends of the first inner tube are in communication with the first peripheral gas passage, a top of the first inner tube is provided with a first communication opening, and the first nozzle is disposed at a bottom of the first outer tube; and wherein the one of the plurality of second central gas passages comprises a second inner tube and a second outer tube, the second outer tube is sleeved outside the second inner tube, two ends of the second inner tube are in communication with the second peripheral gas passage, a top of the second inner tube and a bottom of the second inner tube are both provided with a second communication opening, and on each of two sides of the second outer tube are provided with the second nozzle.

* * * * *